United States Patent [19]

Starkweather et al.

[11] Patent Number: 5,295,100

[45] Date of Patent: Mar. 15, 1994

[54] METHOD FOR PROVIDING A FASTER ONES VOLTAGE LEVEL RESTORE OPERATION IN A DRAM

[75] Inventors: Michael W. Starkweather; Stephen L. Casper, both of Boise, Id.

[73] Assignee: Micron Semiconductor, Inc., Boise, Id.

[21] Appl. No.: 931,095

[22] Filed: Aug. 14, 1992

[51] Int. Cl.⁵ ............................................. G11C 7/00
[52] U.S. Cl. ............................ 365/189.11; 365/190; 365/203; 365/205; 365/207; 365/208
[58] Field of Search ........... 365/203, 189.01, 189.06, 365/189.11, 205, 207, 208, 190; 307/530

[56] References Cited

U.S. PATENT DOCUMENTS

| 4,233,675 | 11/1980 | Karp et al. | 365/205 |
| 4,366,559 | 12/1982 | Missizu et al. | 365/205 |
| 4,370,575 | 1/1983 | McAlexander, III et al. | 307/530 |
| 4,533,843 | 8/1985 | McAlexander, III et al. | 307/530 |
| 4,543,500 | 9/1985 | McAlexander, III et al. | 307/530 |
| 4,636,987 | 1/1987 | Norwood et al. | 365/208 |
| 4,709,354 | 11/1987 | Ichinose et al. | 365/189.11 |
| 4,748,349 | 5/1988 | McAlexander, III et al. | 307/530 |
| 4,914,631 | 4/1990 | Johnson et al. | 365/189.11 |
| 5,042,011 | 8/1991 | Casper et al. | 365/205 |

Primary Examiner—Eugene R. LaRoche
Assistant Examiner—Son Mai
Attorney, Agent, or Firm—Michael W. Starkweather

[57] ABSTRACT

There is a DRAM which provides for a faster non-accessed memory cell ones voltage level refresh or restore process. Specifically, the DRAM does not shut down a digit line's voltage pull-up circuitry (PSA) during a write operation. By leaving on the PSA, the digit lines being pulled to a ones voltage level will continue to be pulled up during the write operation. Thus, digit line will reach the ones voltage level in a shorter time than if the PSA were turned off during the write operation.

5 Claims, 4 Drawing Sheets

METHOD FOR PROVIDING A FASTER ONES VOLTAGE LEVEL RESTORE OPERATION IN A DRAM

FIELD OF THE INVENTION

The present invention relates to DRAMs. Particularly, a DRAM that provides a faster ones voltage level restore operation. Uniquely, the DRAM does not turn off, but current limits, the active pull-up circuitry during a memory cell write cycle.

BACKGROUND OF THE INVENTION

A basic operation of a DRAM is to allow a user to change the electrical information stored in its memory arrays. FIG. 1 is a general illustration of a typical 5 volt DRAM 10, including the following elements: Column decoding circuitry 12, a first half of a memory array 14, an N-channel sense amplifier (NSA) 16, a second half of a memory array 18, and a P-channel sense amplifier (PSA) 20. One skilled in the art will note that the DRAM is symmetrically oriented with the column decode in the center.

Concurring a read operation, and in reference to FIGS. 1 and 2, the column decode 12 routs signals going to and from the memory arrays. When a memory cell is accessed, or to be read, the word line (row line) is turned on, thus selecting the cell to be read and thereby dumping the stored charge of the cell onto the associated digit line. The small charge from the cell will cause a small voltage change on the digit line; either up or down depending whether a one or zero is stored. FIG. 2 illustrates when a ones charge is accessed from the cell. NSA will pull the lower voltage digit line towards ground, this is followed by PSA pulling the corresponding higher voltage digit line up, towards supply voltage (Vcc). The PSA and NSA amplify the voltage differences between the two digit lines associated with a particular memory cell being accessed.

After a read sequence, a write operation takes place. For the sake of simplicity, the operation of writing back a same signal to the memory cell will not be discussed. The more difficult write operation exists when an opposite signal must be written back and stored into the accessed memory cell. This operation involves the switching of the voltages on the two digit lines as illustrated.

Typically, the PSA is turned off during a write back to allow the high digit line to be pulled towards ground and the low voltage digit line to be pulled up towards a ones voltage level. Thereafter attaining a write back, PSA is turned back on to continue recharging the new digit line towards the ones voltage level. Whereby, the respective voltages on the digit lines are clamped, trapping the appropriate charges in the memory cells, and the high and low voltages are equilibrated together to provide for an intermediate per-charged voltage level in preparation for the next cycle.

One skilled in the art will realize why the PSA is turned off during the write operation. Specifically, this allows the switching of the voltages on the digit lines without fighting the effort of the PSA to keep the high voltage digit line at a high voltage.

Problems

By implementing the above described operation, a problem occurs during the write operation. Specifically, beginning with the read operation, after the accessed memory cell's row is turned on, the whole column (or word line) is also turned on. The word line opens all of the gates of the associated memory cells, thereby dumping the stored charges onto the appropriate digit lines. During the write back operation, all of the non-accessed memory cells on the word line are restored to the former charges. This restoration process is accomplished by the NSA and PSA circuits separating and amplifying the voltages on the digit lines before the word line shuts all the memory cell gates, thereby trapping the restored and refreshed charges in the non-accessed or addressed memory cells.

The problem occurs, during a write back operation to the accessed memory cell. Uniquely, not just the accessed memory cell's associated PSA, but all of the PSAs are shut down during the write operation. This shut down has the effect of increasing the total cycle time of restoring or refreshing the non-accessed memory cells. Specifically, there is a slowing down of the voltage pull-up on the non-addressed digit lines. It goes without saying, the global PSA shutdown during the write operation has the effect of increasing the overall operation time for each read-write cycle, and more importantly, slowing down the overall DRAM device.

It is noted that the above described problem, as well as other problems, are solved through the subject invention and will become more apparent, to one skilled in the art, from the detailed description of the subject invention and the accompanied drawings.

SUMMARY OF THE INVENTION

The present invention provides for a DRAM non-accessed memory cell refresh or restore process/operation that reaches a digit line's ones voltage level faster. Specifically, the invention does not shut down any PSAs during the write operation. By leaving on the PSAs, the ones digit lines will continue to be pulled-up towards a ones voltage level even during the write operation. Thus, the digit line being pulled high (being restored to a ones voltage level) will reach the final ones voltage level sooner and obviously shortening the restore operation and ultimately the overall cycle time.

Other features and objects of the present invention will become more clear from the following detailed description of the invention, taken in conjunction with the accompanying drawings and claims, or may be learned by the practice of the invention.

Figure 1:
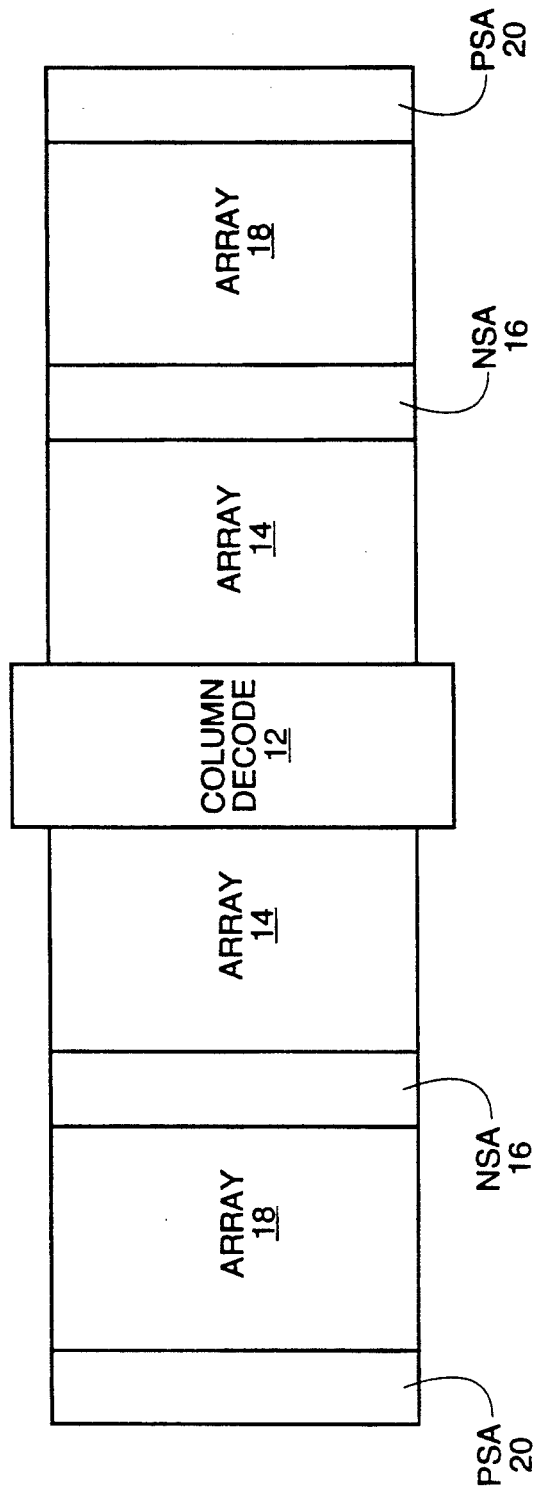
FIG. 1 is a illustration of a particular DRAM architecture.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings. Additionally, like numbering in the drawings represent like elements within and between drawings.

DETAILED DESCRIPTION OF THE ILLUSTRATED EMBODIMENT

Incorporated Material

The following U.S. patents are herein incorporated by reference for pertinent and supporting information:

U.S. Pat. No. 5,042,011, is a sense amplifier pulldown device with tailored edge input.

U.S. Pat. No. 4,636,987, is a semiconductor dynamic memory device with multiplexed sense amplifier and write activated active loads.

U.S. Pat. No. 4,370,575, is a high performance dynamic sense amplifier with active loads.

U.S. Pat. No. 4,233,675, is a X sense amp memory.

U.S. Pat. No. 4,366,559, is a memory device.

U.S. Pat. No. 4,533,843, is a high performance dynamic sense amplifier with voltage boost for row address lines.

U.S. Pat. No. 4,748,349, is a high performance dynamic sense amplifier with voltage boost for row address lines.

U.S. Pat. No. 4,543,500, is a high performance dynamic sense amplifier voltage boost for row address lines.

For the purpose of providing background material which may in some respects illustrate the state of the art, the following book is herein incorporated by reference: Electronic Devices, by Thomas L. Floyd, 2nd ed., pub. by Merrill, a Bell & Howell informations company, Columbus, Ohio.

Definitions

It is noted that the terminology of "the digit line being pulled high" has the same meaning as a "ones digit line" or a "digit line being restored to a ones voltage level." All describe one of the digit lines in a pair that has its voltage being pulled towards a ones voltage level.

General Embodiment

Figure 2:
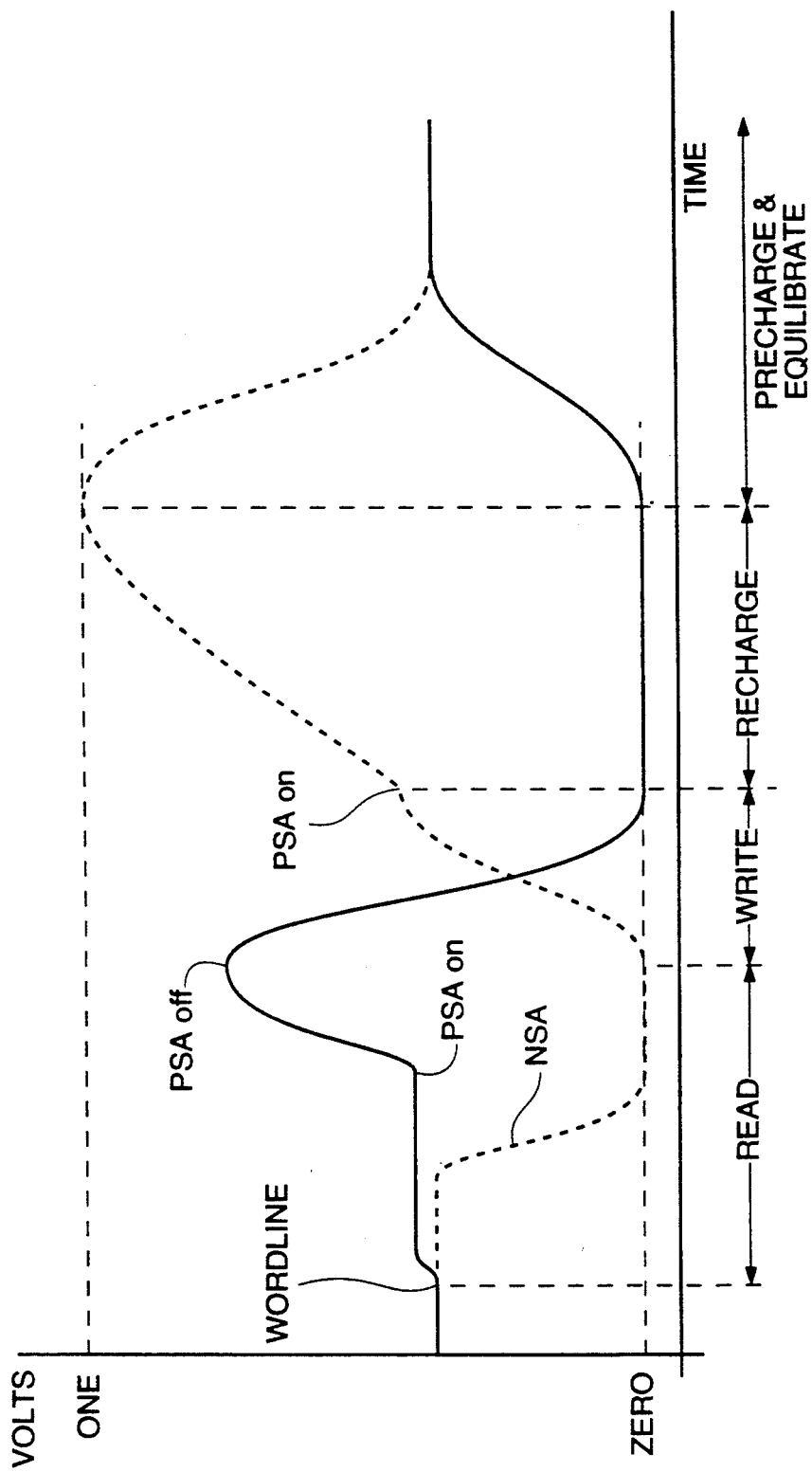
FIG. 2 is a typical voltage vs. timing graph illustrating the cycle of a read, write, recharge, and equilibrate operation for the two addressed digit lines.
Figure 3:
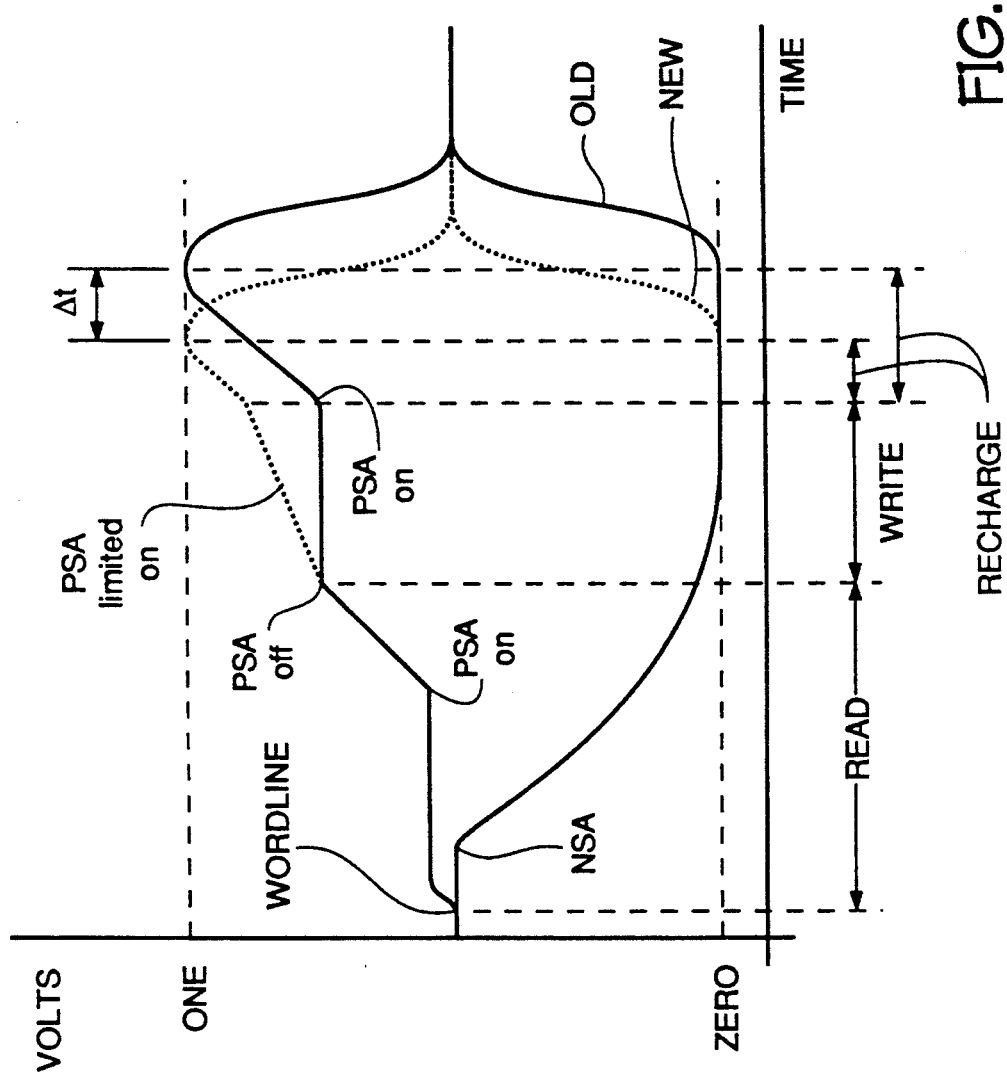
FIG. 3, in reference to FIG. 2, respectively illustrates the voltage vs. time graph for the non-addressed pairs of digit lines for the old and new proposed method of operation.

A general embodiment of the improved timing cycle for the non-accessed memory cells located on the activated word line is illustrated in FIG. 3. One skilled in the art will understand the general operation of the voltage versus time diagram of a typical non-accessed pair of digit lines as in FIG. 3 in reference to the simultaneous timing with the accessed pair of digit lines of FIG. 2.

In operation, the word line is activated, in this case, a ones charge is dumped onto the digit line. The NSA fires, pulling the other digit line low, towards the digital zeros voltage level. The PSA fires, pulling the higher voltage digit line towards the digital ones voltage level. The difference between the new and prior art (old) embodiments develops at the beginning of the write operation. The old method shuts off the PSA, during which time there is no more recharging of the associated digit lines towards the ones voltage level. After the write operation, PSA is reactivated, thus continuing the digit line's voltage pull-up.

In distinction, the new method (illustrated by the dotted lines), will not turn off the PSA, but merely limit the current to PSA 20. As a result, the voltage on the digit line keeps increasing; although at a somewhat slower rate of increase. Again, as in the old method, after the write operation, PSA 20 is fully activated (having no current limiting), and resumes the final recharge operation, at the prior faster rate of voltage pull-up towards the ones voltage level. As illustrated by "delta t", the new approach will 1) reach ones voltage level sooner than the old method, 2) allow for sooner equilibrate and precharge operation in preparation for the next cycle, and 3) shorten the overall cycle time.

Specific Embodiment

Figure 4:
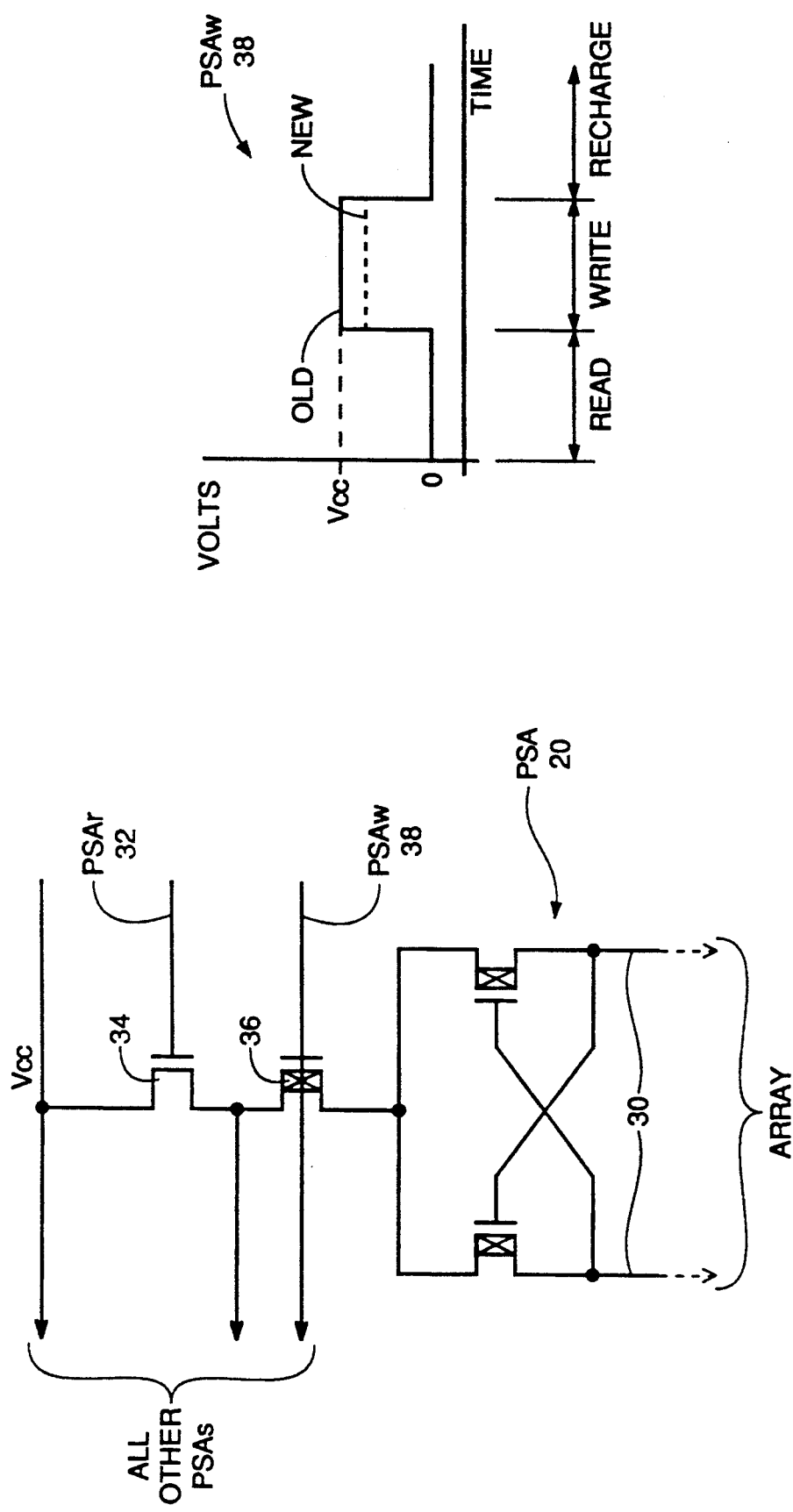
FIG. 4 is a circuitry of a PSA and associated signal controls.

Referring to FIG. 4, there is a circuit illustrating one of many PSAs and its associated control circuitry. Uniquely, PSA 20 is a cross coupled P-channel device, connected to a pair of digit lines 30. PSA 20 is activated (receives a supply voltage Vcc) when PSAr (PSA read) 32 signal is pulsed high, thereby turning on transistor 34.

Figure 5:
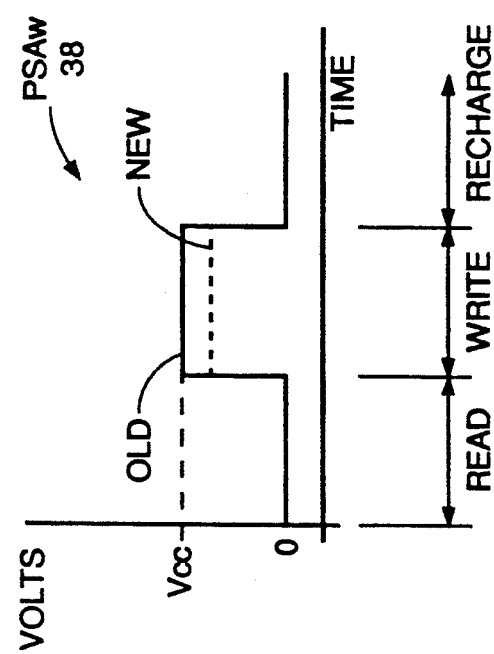
FIG. 5 is a timing diagram of the PSA write signal controlling the current flow between Vcc and PSA.

In reference to FIG. 5, during the prior art write operation, the PSAw (PSA write) 38 signal is pulsed (indicated by OLD), thereby turning off transistor 36 and consequently PSA 20. In contrast, during the current invention's write operation, PSAw signal 38 (NEW) will similarly be pulsed, but with a smaller voltage. Thereby transistor 36 will not shut off. However, transistor 36 will limit the current from Vcc to PSA 20; thereby accomplishing 1) allowing switching of the voltages on the accessed digit lines, and 2) continuously allowing active voltage pull-up, during the entire write operation, of the non-addressed digit lines; thereby shortening the overall time to reach the ones voltage level.

Remarks on the Invention

It is noted that FIGS. 2 and 3 take place simultaneously. All references to the sequence of events in the non-addressed digit lines are related to the operation occurring during a writing back of an opposite charge to the addressed memory cell.

One skilled in the art will know that there are many methods of limiting the current to transistor 36 via limiting PSAw signal 38. The basic principal being: lowering of the absolute value of the voltage between the gate and source (typically referred to Vgs) of transistor 36 which thereby lowers the current that can pass therethrough to maintain the activation of PSA 20 during the write operations.

While the invention has been taught with specific reference to one embodiment, someone skilled in the art will recognize that changes can be made in form and detail without departing from the spirit and the scope of the invention. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by U.S. patent is:

1. A method of operation for a DRAM device, comprising:
   providing digit line voltage pull-up amplifying circuitry (PSA 20);
   reading a selected DRAM memory cell;
   performing a write operation, for writing a signal back to the selected cell; and
   maintaining current to the pull-up circuitry (20) during the write operation at a lower current than during the reading of the memory cell.

2. The method of claim 1, further comprising:
   providing column decode circuitry (12) transversing down the DRAM architecture;
   providing a first half of arrayed of memory cells (14) having a first and second edge, whereby the first edge is adjacently located on one side of the column decode circuitry (12);
   providing a digit line voltage pull-down amplifying circuitry (NSA 16) having a first and second boundary edge, whereby the first edge of the pull-down circuitry is adjacently located on the second edge of the first half of arrayed memory cells;
   providing a second half of arrayed memory cells (18), having a first and second boundary edge, whereby the first edge of the second half of arrayed memory cells is adjacently located on the second boundary edge of the pull-down circuitry; and
   providing a digit line voltage pull-up amplifying circuitry (PSA 20) having a first and second boundary edge, whereby the first edge of the pull-up circuitry is adjacently located on the second edge of the second half of arrayed memory cells.

3. A method of operating a DRAM's read write back, and recharge operations to accessed and non-accessed memory cells, where the operation of writing back, or restoring similar charge to the cells, to the non-accessed cells comprises the step of:
   while performing a write back operation to the selected cell, simultaneously maintaining a current through pull up circuitry to the non-accessed cells during the write back operation of the accessed cells, where the current is lower than during the read and recharge operations to the non-accessed cells.

4. A method of operating a DRAM's read write back, and recharge operations to accessed and non-accessed memory cells, where the operation of writing back, or restoring a digital charge to the non-accessed cells comprises the step of:
   maintaining a current through pull up circuitry to the non-accessed cells during the write operation to accessed cell, where the current is lower than during the read and recharge operations to the non-accessed cells.

5. A method of operating a DRAM's read write back, and recharge operations to addressed and non-addressed memory cells, where the operation of writing back, or restoring a digital charge to the non-addressed cells comprises the step of:
   providing a plurality of P-channel sense amplifiers electrically coupled to all digit lines and memory cells of the DRAM;
   providing a first and second transistor linearly coupled between power supply and the P-channel sense amplifiers for providing power thereto;
   performing a read operation in the DRAM to selected addressed cells, by turning on both the first and second transistors, thereby providing a full current supplied to the P-channel sense amplifiers; and
   performing a write operation in the DRAM, where the voltage to the second transistor gate is lowered than during the read and recharge operations, thus lowering the current to an amount less than full current to all of the non-addressed cells via the P-channel sense amplifiers, thereby allowing non-addressed cells to continue charging to a ones level during the write operation to the addressed cells.

* * * * *